(12) United States Patent
Maeda

(10) Patent No.: US 11,476,368 B2
(45) Date of Patent: Oct. 18, 2022

(54) SEMICONDUCTOR DEVICE

(71) Applicant: LAPIS SEMICONDUCTOR CO., LTD., Yokohama (JP)

(72) Inventor: Kanta Maeda, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 17/106,585

(22) Filed: Nov. 30, 2020

(65) Prior Publication Data

US 2021/0167213 A1    Jun. 3, 2021

(30) Foreign Application Priority Data

Dec. 3, 2019 (JP) .............................. JP2019-218635

(51) Int. Cl.
| | |
|---|---|
| *H01L 29/788* | (2006.01) |
| *H01L 29/423* | (2006.01) |
| *H01L 29/66* | (2006.01) |
| *H01L 21/28* | (2006.01) |

(52) U.S. Cl.
CPC .... *H01L 29/7883* (2013.01); *H01L 29/40114* (2019.08); *H01L 29/42324* (2013.01); *H01L 29/66825* (2013.01)

(58) Field of Classification Search
None
See application file for complete search history.

(56) References Cited

U.S. PATENT DOCUMENTS

| | | | |
|---|---|---|---|
| 2009/0001445 A1* | 1/2009 | Park | H01L 29/40114 257/316 |
| 2013/0256772 A1* | 10/2013 | Fu | H01L 21/76237 257/298 |
| 2018/0083023 A1* | 3/2018 | Murata | H01L 27/11521 |
| 2019/0067274 A1* | 2/2019 | Marzaki | H01L 21/76224 |

FOREIGN PATENT DOCUMENTS

JP    H09129760 A    5/1997

* cited by examiner

*Primary Examiner* — Xiaoming Liu
(74) *Attorney, Agent, or Firm* — Volentine, Whitt & Francos, PLLC

(57) ABSTRACT

A semiconductor device constituting a non-volatile memory includes a semiconductor portion of a first conductivity type, a first well of a second conductivity type, a second well of the second conductivity type, an insulating film, and a conductive layer. The first well includes a trench extending from the surface of the semiconductor portion to an inside of the first well. The insulating film extends on a surface inside the trench. A conductive portion formed continuous with the conductive layer is disposed on the insulating film inside the trench.

7 Claims, 11 Drawing Sheets

SEMICONDUCTOR DEVICE

CROSS-REFERENCE TO RELATED APPLICATION

This application is based upon and claims the benefit of priority from the prior Japanese Patent Application No. 2019-218635 filed on Dec. 3, 2019, the entire contents of which are incorporated herein by reference.

BACKGROUND

1. Technical Field

The present invention relates to a semiconductor device.

2. Description of the Related Art

As a non-volatile storage device, a non-volatile memory that memorizes and erases data by changing accumulated states of electric charges in floating gates as electrically insulated floating electrode layers has been known. A general structure of the non-volatile memory is what is called a stack type structure in which polysilicon layers constituting floating gates and polysilicon layers constituting control gates are stacked and arranged.

Meanwhile, unlike the stack type non-volatile memory, there has been known a single-layer polysilicon type non-volatile memory constituted using single-layer polysilicon (for example, JP-A-9-129760). In the single-layer polysilicon type non-volatile memory, for example, a first well region functioning as a control gate, a second well region functioning as a read gate, and a third well region functioning as a tunnel gate are disposed near a superficial layer portion of a semiconductor substrate. On the substrate, a gate insulating film and the floating gate made of a single-layer polysilicon are formed so as to overlap from the first well region to the third well region.

Capacitors corresponding to the floating gate, the read gate, and the tunnel gate are formed at parts opposed to the floating gates with the respective gate insulating films of the first well region, second well region, and third well region interposed therebetween. Then, a voltage is applied to each of the control gate, the read gate, and the tunnel gate, electric potentials of the floating gates are changed, and thus an operation, such as writing or erasure of data, is executed.

For example, during data writing, a voltage Vw (Vw>0 V), 0 V, and an intermediate voltage Vc (0 V<Vc<Vw) are applied to the control gate, the tunnel gate, and the read gate, respectively. In response to the application of the voltage Vw to the control gate, the electric potential of the floating gate increases, and the electric charge is injected from the third well region (namely, the tunnel gate) to the floating gate. Meanwhile, during data erasure, 0 V, the voltage Vw, and the intermediate voltage Vc are applied to the control gate, the tunnel gate, and the read gate, respectively. In response to the application of the voltage 0 V to the control gate, the electric potential of the floating gate decreases, and the electric charge accumulated in the floating gate moves to the third well region.

For efficient execution of the operations of the writing and the erasure of data, capacitance of the control gate is preferably relatively larger than capacitance of the read gate and the capacitance of the tunnel gate such that the electric potential of the floating gate becomes close to the voltage applied to the control gate.

Generally, capacitance of a capacitor, such as a plate capacitor, is proportional to an area of an electrode. In the above-described single-layer polysilicon type non-volatile memory, an area of a part where the floating gate overlaps with the control gate is equivalent to the "area of the electrode." In view of this, when the capacitance of the control gate is attempted to be increased, the area of the control gate overlapping with the floating gate (that is, an area of the first well region in a direction parallel to the semiconductor substrate) needs to be increased. Accordingly, when the capacitance of the control gate is increased, there has been a problem that a unit area of a memory cell increases as a result.

The present invention has been made in consideration of the problems, and an object of the present invention is to provide a non-volatile memory having a small area and a sufficient capacity.

According to the present invention, a semiconductor device constituting a non-volatile memory, comprising: a semiconductor portion of a first conductivity type; a first well of a second conductivity type formed to extend from a first region in the surface of the semiconductor portion to an inside, the second conductivity type having a reversed polarity of the first conductivity type; a second well of the second conductivity type formed to be separated from the first region so as to extend from a second region in the surface of the semiconductor portion to an inside; an insulating film formed on the surface of the semiconductor portion; and a conductive layer formed to extend across a region on an upper side of the first well and a region on an upper side of the second well on the insulating film, wherein the first well includes a trench extending from the surface of the semiconductor portion to an inside of the first well, the insulating film extends on a surface inside the trench, and a conductive portion formed continuous with the conductive layer is disposed on the insulating film inside the trench.

According to the present invention, a semiconductor device constituting a non-volatile memory, comprising: a semiconductor portion of a first conductivity type; a first well of a second conductivity type formed to extend from a first region in the surface of the semiconductor portion to an inside, the second conductivity type having a reversed polarity of the first conductivity type; a second well of the second conductivity type formed to be separated from the first region so as to extend from a second region in the surface of the semiconductor portion to an inside; an insulating film formed on the surface of the semiconductor portion; and a conductive layer formed to extend across a region on an upper side of the first well and a region on an upper side of the second well on the insulating film, wherein the insulating film includes a first region and a second region, the first region extends to be positioned on an upper side of the first well and has a first film thickness, and the second region has a second film thickness thicker than the first film thickness.

The semiconductor device of the present invention allows decreasing an area while maintaining a capacity of a memory cell in the non-volatile memory.

BRIEF DESCRIPTION OF THE DRAWINGS

Features of the present invention will be described below with reference to the accompanying drawings.

DETAILED DESCRIPTION

Figure 1:
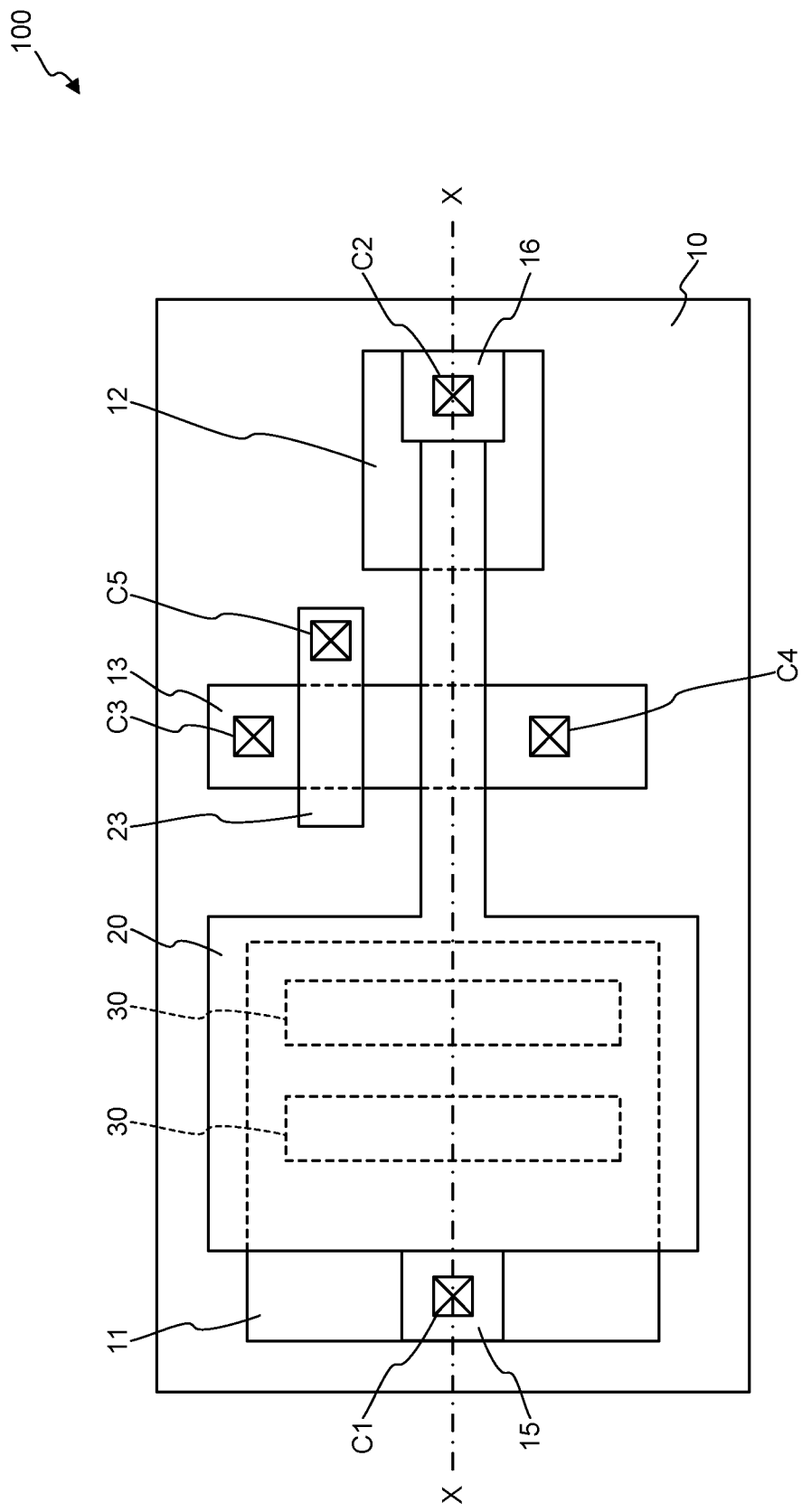
FIG. 1 is a top view illustrating a configuration of a semiconductor device according to Embodiment 1 of the present invention.

Preferred embodiments of the present invention will be described in detail below. Note that the same reference numerals are given to substantially identical or equivalent parts in the description in the following respective embodiments and the accompanying drawings.

Embodiment 1

FIG. 1 is a top view of a semiconductor device 100 according to an embodiment viewed from above an element formation surface.

The semiconductor device 100 includes a semiconductor substrate 10, a first well 11, a second well 12, and a third well 13. The first well 11, the second well 12, and the third well 13 are formed inside the semiconductor substrate 10 so as to be exposed to one surface (namely, an element mounting surface) of the semiconductor substrate 10. On the one surface of the semiconductor substrate 10, a gate polysilicon 20 is formed so as to cover a part of each of the first well 11, the second well 12, and the third well 13.

The semiconductor substrate 10 is made of, for example, a silicon (Si) substrate and has a rectangular shape in top view.

The third well 13 is a well region of a first conductivity type (for example, a P type). Meanwhile, the first well 11 and the second well 12 are well regions of a second conductivity type (for example, a N type), which has the reversed polarity of the first conductivity type.

The surface of the first well 11 exposed to the one surface of the semiconductor substrate 10 (hereinafter simply referred to as the surface of the first well 11) has a rectangular shape in top view.

A diffusion layer 15 of the second conductivity type is formed on the first well 11. The diffusion layer 15 is exposed to the surface of the first well 11. To the diffusion layer 15, a contact C1 made of a conductor, such as tungsten, is coupled. The diffusion layer 15 and the contact C1 are formed in a region not covered with the gate polysilicon 20 of the surface of the first well 11. That is, the diffusion layer 15 and the contact C1 are exposed to the one surface of the semiconductor substrate 10.

Trenches 30 are formed from the surface of the first well 11 to the inside. As indicated by the dashed lines in FIG. 1, the trenches 30 (namely, openings of the trenches 30) in the surface of the first well 11 have a rectangular shape having long sides in a short side direction of the semiconductor substrate 10 in top view (that is, a rectangular having short sides extending in a long side direction of the semiconductor substrate 10). This embodiment shows an example in which the two trenches 30 are formed in the first well 11.

The trenches 30 are formed at parts covered with the gate polysilicon 20 on the surface of the first well 11. That is, the openings of the trenches 30 are covered with the gate polysilicon 20.

The second well 12 is formed separated from the first well 11 in the long side direction of the semiconductor substrate 10. The surface of the second well 12 exposed to the one surface of the semiconductor substrate (hereinafter simply referred to as the surface of the second well 12) 10 has a rectangular shape in top view.

A diffusion layer 16 of the second conductivity type is formed on the second well 12. The diffusion layer 16 is exposed to the surface of the second well 12. To the diffusion layer 16, a contact C2 made of a conductor, such as tungsten, is coupled. The diffusion layer 16 and the contact C2 are formed in a region not covered with the gate polysilicon 20 of the surface of the second well 12. That is, the diffusion layer 16 and the contact C2 are exposed to the one surface of the semiconductor substrate 10.

The third well 13 is formed in a region between the first well 11 and the second well 12. The surface of the third well 13 exposed to the one surface of the semiconductor substrate 10 has a rectangular shape having long sides extending in the short side direction of the semiconductor substrate 10 in top view (that is, a rectangular having short sides extending in the long side direction of the semiconductor substrate 10).

To the third well 13, contacts C3 and C4 made of a conductor, such as tungsten, are coupled. The contacts C3 and C4 are formed in regions not covered with the gate polysilicon 20 of the surface of the third well 13. That is, the contacts C3 and C4 are exposed to the one surface of the semiconductor substrate 10.

The gate polysilicon 20 is a single-layer conductive layer made of a polysilicon film. The gate polysilicon 20 is formed across the first well 11 and the second well 12 to expose a part of each of the first well 11 and the second well 12. In this embodiment, the gate polysilicon 20 has a rectangular part that covers a part of the surface of the first well 11 and a strip-shaped part extending from this rectangular part so as to cover a part of each of the third well 13 and the second well 12.

A selection transistor 23 is formed so as to cover a part of the surface of the third well 13. For example, the selection transistor 23 has a rectangular shape in top view and is disposed such that the selection transistor 23 has its long side direction perpendicular to the long side direction of the part exposed on the one surface of the semiconductor substrate 10 of the third well 13.

Figure 2:
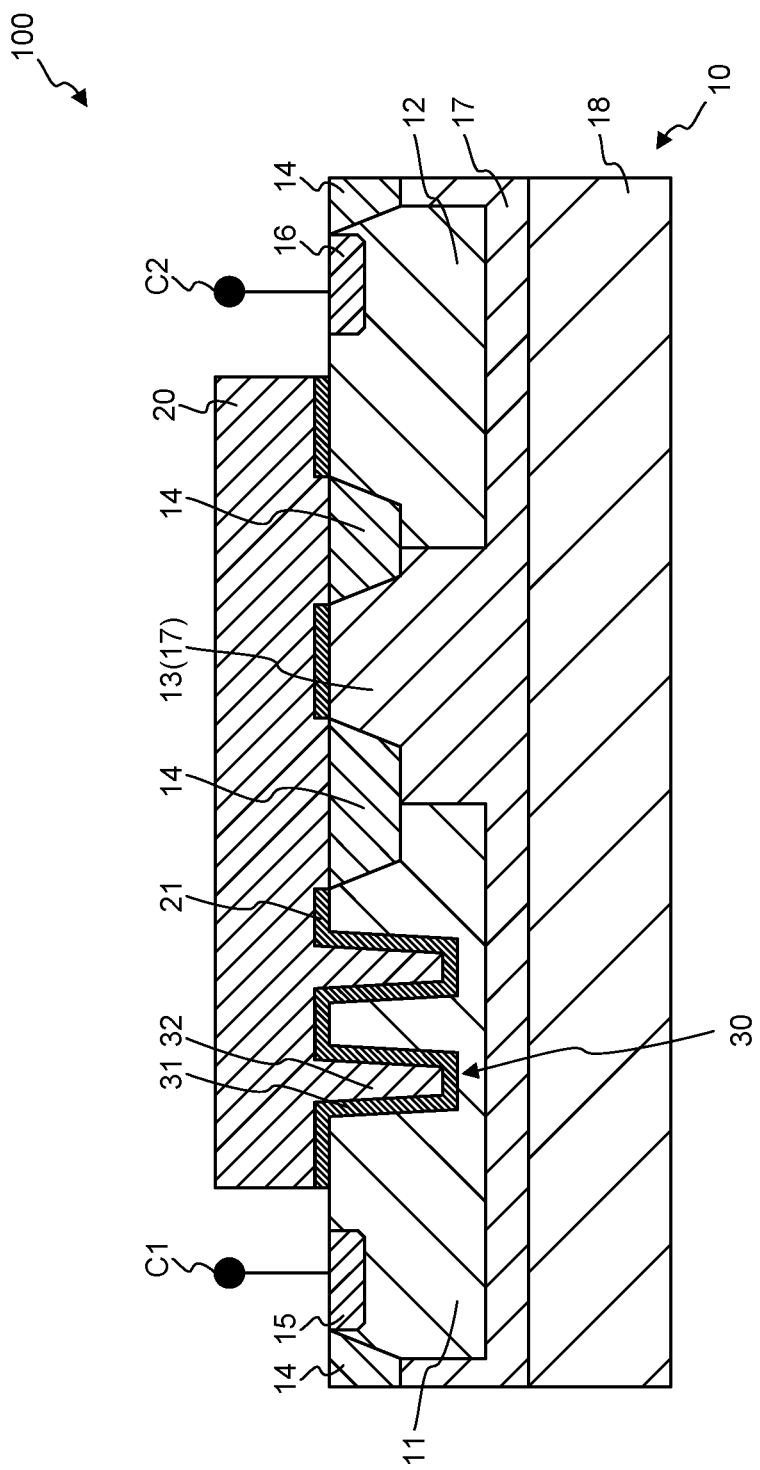
FIG. 2 is a cross-sectional view along the line X-X of the semiconductor device in FIG. 1.

FIG. 2 is a cross-sectional view along the line X-X in FIG. 1.

The third well 13 is constituted of a semiconductor layer 17 of the first conductivity type formed on a superficial layer portion of the semiconductor substrate 10. The semiconductor layer 17 is formed to extend to the inside from the one surface of the semiconductor substrate 10.

The semiconductor layer 17 is formed by implanting first conductivity type ions to the semiconductor substrate 10. FIG. 2 illustrates a region of the semiconductor substrate 10 where the ions are not implanted (that is, a region positioned underneath the semiconductor layer 17) as an undoped silicon substrate region 18.

The first well 11 is formed on the superficial layer portion of the semiconductor layer 17. That is, the first well 11 is formed to extend to the inside of the semiconductor layer 17 from the one surface of the semiconductor substrate 10.

The second well 12 is formed at a position separated from the first well 11 on the superficial layer portion of the semiconductor layer 17. Similarly to the first well 11, the second well 12 is formed to extend to the inside of the semiconductor layer 17 from the one surface of the semiconductor substrate 10.

The third well 13 is constituted of a region interposed between the first well 11 and the second well 12 on the semiconductor layer 17.

Element isolation regions 14 are formed in regions between the respective first well 11, second well 12, and third well 13. The element isolation regions 14 have a Shallow Trench Isolation (STI) structure and are disposed to surround peripheral areas of the respective first well 11, second well 12, and third well 13. Note that FIG. 1 omits the illustration of the element isolation regions 14.

The diffusion layer 15 is constituted by injecting second conductivity type impurities (for example, phosphorus or arsenic in a case of a N type). The diffusion layer 16 is constituted by injecting second conductivity type impurities to the surface of the second well 12.

Gate insulating films 21 are formed between the gate polysilicon 20 and each of the surfaces of the first well 11, the second well 12, and the third well 13. For example, the gate insulating film 21 is made of a silicon oxide film. The gate insulating film 21 is formed so as to cover a part of each of the first well 11 and the second well 12 and cover the third well 13.

Note that a sidewall of the gate polysilicon 20 is covered with a side wall (not illustrated) constituted of an insulating film, such as a silicon oxide film.

As illustrated in FIG. 2, the trench 30 extends from the surface opposed to the gate polysilicon 20 of the first well 11 to the inside of the first well 11 in cross-sectional view. For example, the trench 30 has a trapezoidal shape with a depth direction of the first well 11 (that is, a direction perpendicular to the surface of the first well 11) as a height direction in cross-sectional view. For example, when a width (see FIG. 1) of the trench 30 in the long side direction of the semiconductor substrate 10 is set to be several hundred nm to several μm, the trench 30 is formed to have the depth of about 20 μm in the direction perpendicular to the one surface of the semiconductor substrate 10.

On a surface of an inner wall of the trench 30, a trench lining insulating film 31 formed continuous with the gate insulating film 21 is formed along the shape of the trench 30. The trench lining insulating film 31 is made of the material identical to that of the gate insulating film 21 (that is, the silicon oxide film in this embodiment).

A trench lining conductive portion 32 formed continuous with the gate polysilicon 20 is formed so as to fill the trench 30. The trench lining conductive portion 32 is made of the material identical to that of the gate polysilicon 20 (that is, polysilicon). The trench 30, the trench lining insulating film 31, and the trench lining conductive portion 32 integrally constitute a trench capacitor.

The semiconductor device 100 is a memory cell constituting a single-layer polysilicon type, non-volatile semiconductor memory. The gate polysilicon 20 is a conductive layer constituting a floating gate of this memory cell.

The first well 11 is a well region functioning as a control gate when data is written to or erased from this memory cell. The second well 12 is a well region functioning as a tunnel gate when data is written to or erased from this memory cell. The third well 13 is a well region functioning as a read gate when data is read from this memory cell.

For example, during data writing, a voltage Vw (Vw>0 V) is applied to the contact C1, and 0 V is applied to the contact C2. Accordingly, the gate polysilicon 20 becomes to have an electric potential close to the voltage Vw, and the electric charge is injected from the second well 12 to the gate polysilicon 20. Meanwhile, during data erasure, 0 V is applied to the contact C1, and the voltage Vw is applied to the contact C2. Accordingly, the gate polysilicon 20 becomes to have an electric potential close to 0 V, and the electric charge moves from the gate polysilicon 20 to the second well 12. The gate insulating film 21 functions as a tunnel oxide film in the electric charge movement between the gate polysilicon 20 and the second well 12.

To the contacts C3 and C4, which are coupled to the third well 13, an intermediate voltage Vc (0<Vc<Vw) is applied during data writing and during data erasure. During data reading, a read current according to the accumulated state of the electric charge in the gate polysilicon 20 flows to the third well 13.

As described above, the trenches 30 are disposed in the first well 11 of the semiconductor device 100 of this embodiment. The trench 30 constitutes the trench capacitor together with the trench lining insulating film 31 and the trench lining conductive portion 32. In view of this, for example, compared with another non-volatile memory that has a similar extent of capacitance of a control gate and does not have a trench capacitor, the semiconductor device 100 has a smaller area of the entire memory cell. This will be described below.

Generally, when capacitance is defined as C, a dielectric constant as c, an inter-electrode distance as d, and an electrode area as A, capacitance of a parallel-plate capacitor is expressed as the following equation (Math. 1).

$$C = \frac{\varepsilon}{d}A \qquad \text{[Math. 1]}$$

In the single-layer polysilicon type memory cell like the semiconductor device 100 of this embodiment, when the capacitance of the control gate is defined as C, an area of a part where the first well 11 as the control gate is opposed to the gate polysilicon 20 as the floating gate with the gate insulating film 21 interposed therebetween is equivalent to the electrode area A. Therefore, the larger the area of the part where the first well 11 is opposed to the gate polysilicon 20 with the gate insulating film 21 interposed therebetween, the larger the capacitance of the control gate becomes.

In the semiconductor device 100 of this embodiment, the trenches are disposed in the regions opposed to the gate polysilicon 20 of the first well 11 and these parts have a three-dimensional structure. In view of this, compared with a case where the trenches 30 are not disposed, an opposed area between the first well 11 and the gate polysilicon 20 is large. Accordingly, compared with the semiconductor device without trenches, the capacitance of the control gate is relatively larger in the semiconductor device 100 of this embodiment.

Provisionally, when the capacitance of the control gate equivalent to that of the semiconductor device 100 of this embodiment is attempted to be achieved in the structure in which the trenches are not disposed in the regions opposed to the gate polysilicon 20 of the first well 11, the first well 11 and the gate polysilicon 20 need to be further extended in a horizontal direction to increase an area of the opposed part. In view of this, a size of the entire memory cell increases.

In contrast to this, since the electrode area A is large by the amount of the trenches 30 in the semiconductor device 100 of this embodiment, the area in the horizontal direction needs not to be increased. Accordingly, the semiconductor device 100 of this embodiment allows reducing the memory size small while maintaining the capacitance of the control gate.

Additionally, since the capacitance of the control gate can be increased relative to the capacitance of the read gate and the capacitance of the tunnel gate in the semiconductor device 100 of this embodiment, the electric potential of the floating gate can be a value close to the voltage applied to the control gate. Therefore, in the operations of the writing and erasure of data, electrons can sufficiently move between the floating gate and the tunnel gate (that is, between the gate polysilicon 20 and the second well 12).

Figure 3:
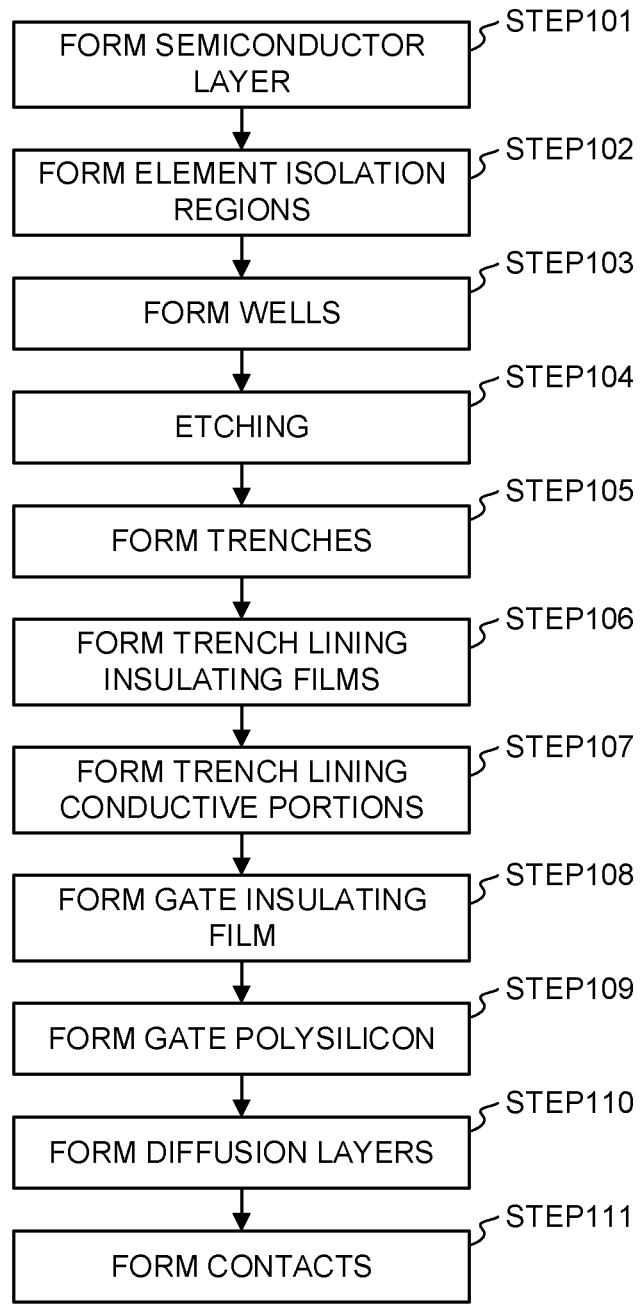
FIG. 3 is a flowchart depicting a manufacturing procedure of the semiconductor device.

Next, a method for manufacturing the semiconductor device 100 of this embodiment will be described following a manufacturing flow depicted in FIG. 3.

Figure 4A:
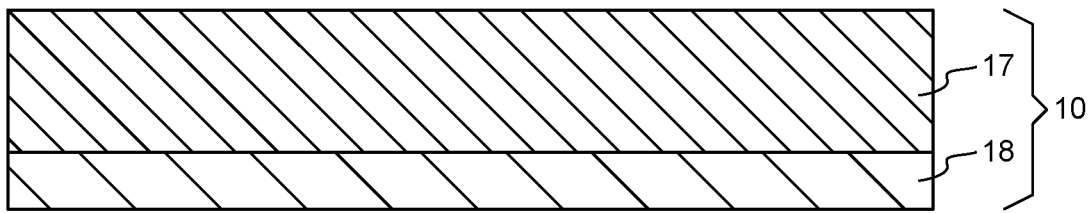
FIG. 4A is a cross-sectional view representing the cross-sectional surface on the line X-X in a semiconductor layer forming process.

First, as illustrated in FIG. 4A, a semiconductor region of the first conductivity type is formed on a superficial layer portion of the semiconductor substrate 10 by ion implantation method. This forms the semiconductor layer 17 of the first conductivity type (STEP 101).

Figure 4B:
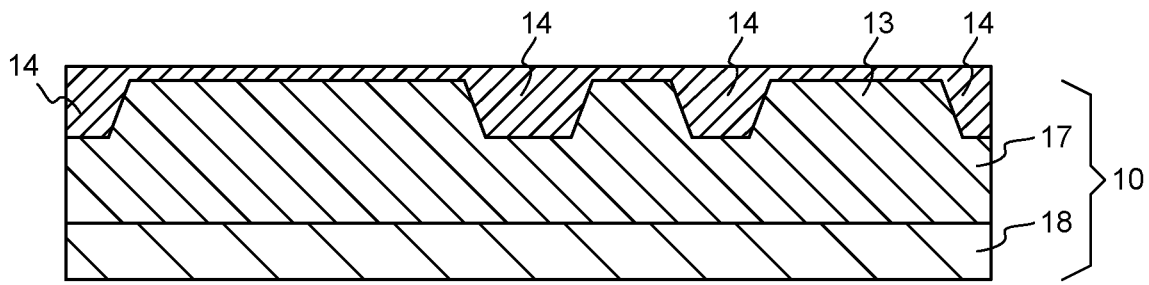
FIG. 4B is a cross-sectional view representing the cross-sectional surface on the line X-X in an element isolation region forming process.

Next, as illustrated in FIG. 4B, grooves are formed in the surface of the semiconductor layer 17 by etching, and an insulating film, such as $SiO_2$, is formed on the entire surface of the semiconductor substrate 10 including the grooves by Chemical Vapor Deposition (CVD) method. This forms the element isolation regions 14 (STEP 102).

Figure 4C:
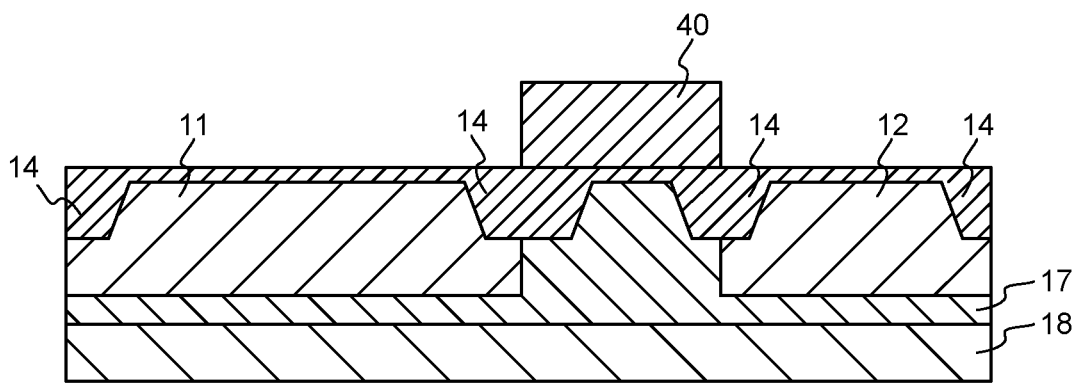
FIG. 4C is a cross-sectional view representing the cross-sectional surface on the line X-X in a well forming process.

Next, as illustrated in FIG. 4C, a resist film 40 patterned by photolithography is formed on the surface of the semiconductor layer 17. Then, for example, P+ (phosphorus) or As+ (arsenic) is injected as the second conductivity type (N type in this embodiment) impurities to the surface of the semiconductor layer 17 by ion implantation. This forms the first well 11 and the second well 12 of the second conductivity type (STEP 103).

Figure 4D:
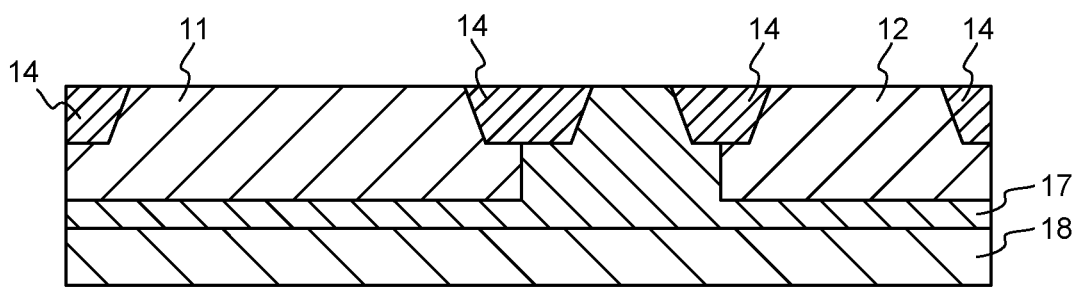
FIG. 4D is a cross-sectional view representing the cross-sectional surface on the line X-X in an etching process.

Next, as illustrated in FIG. 4D, the entire surface is etched to remove the insulating film on the surface of the semiconductor substrate 10 other than the element isolation regions 14. This exposes the surfaces of the first well 11 and the second well 12 (STEP 104).

Figure 5A:
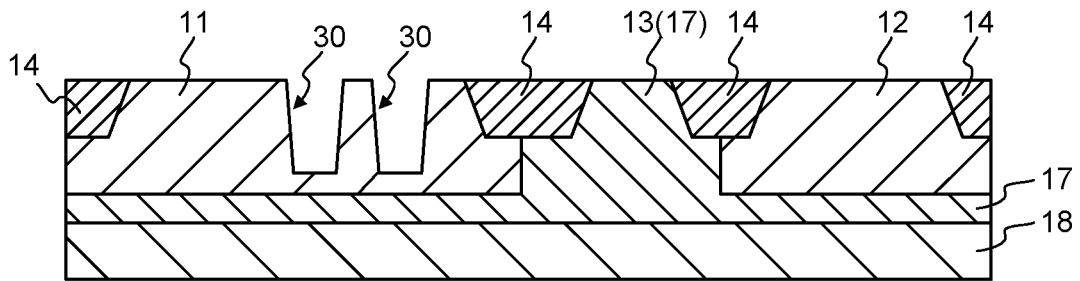
FIG. 5A is a cross-sectional view representing the cross-sectional surface on the line X-X in a trench forming process.

Next, as illustrated in FIG. 5A, the surface of the first well 11 is etched to form the trenches 30 (STEP 105).

Figure 5B:
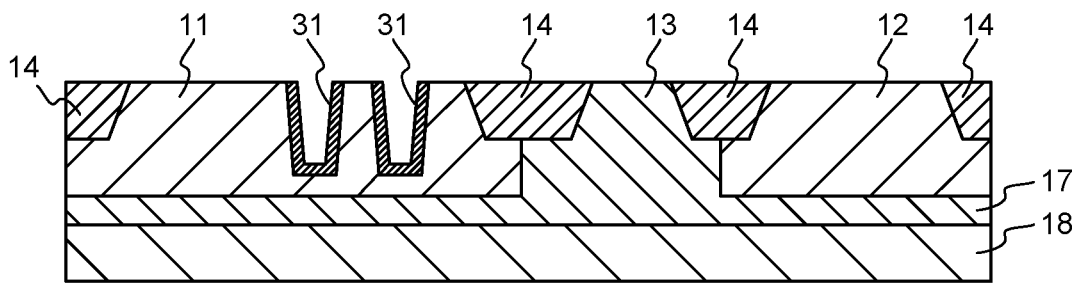
FIG. 5B is a cross-sectional view representing the cross-sectional surface on the line X-X in a trench lining insulating film forming process.

Next, as illustrated in FIG. 5B, the silicon oxide films (namely, the trench lining insulating films 31) that cover the insides of the trenches 30 are formed by thermal oxidation method (STEP 106).

Figure 5C:
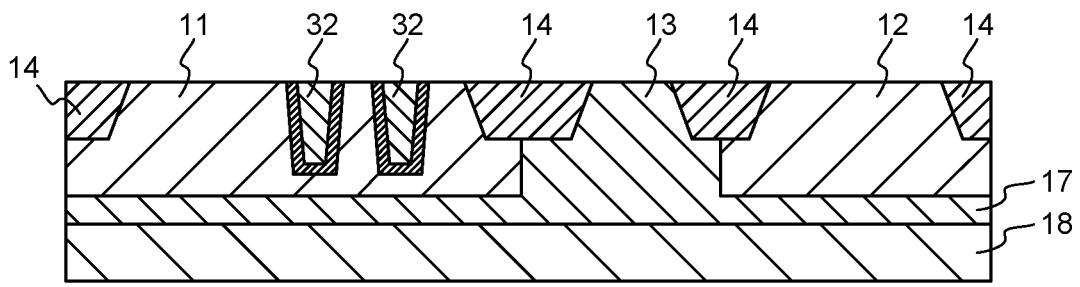
FIG. 5C is a cross-sectional view representing the cross-sectional surface on the line X-X in a trench lining conductive portion forming process.

Next, as illustrated in FIG. 5C, the trench lining conductive portions 32 are formed on the insides of the trenches 30 by CVD method (STEP 107).

Figure 5D:
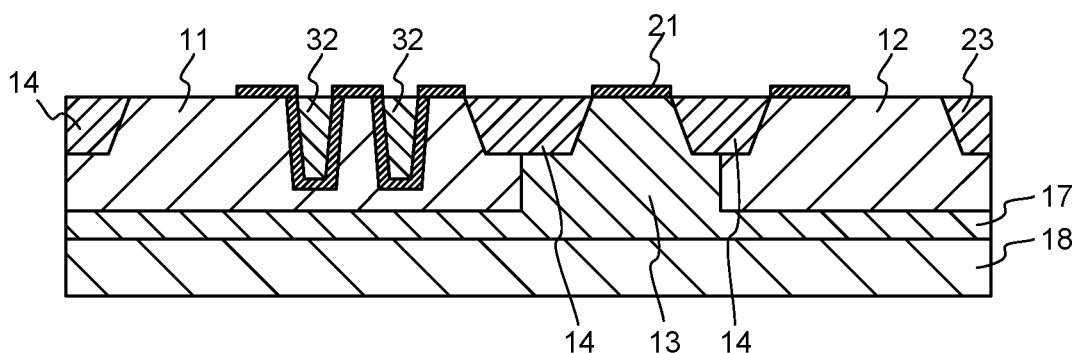
FIG. 5D is a cross-sectional view representing the cross-sectional surface on the line X-X in a gate insulating film forming process.

Next, a silicon oxide film is formed so as to cover a part of each of the first well 11 and second well 12 and cover the third well 13 by thermal oxidation method. Then, the silicon oxide films on the top surfaces of the trench lining conductive portions 32 are removed by etching. In view of this, as illustrated in FIG. 5D, the gate insulating film 21 that covers a part of each of the first well 11 and the second well 12 and covers the third well 13 and has the shape continuous with the trench lining insulating films 31 formed at STEP 105 on the peripheries of the trenches is formed (STEP 108).

Figure 6A:
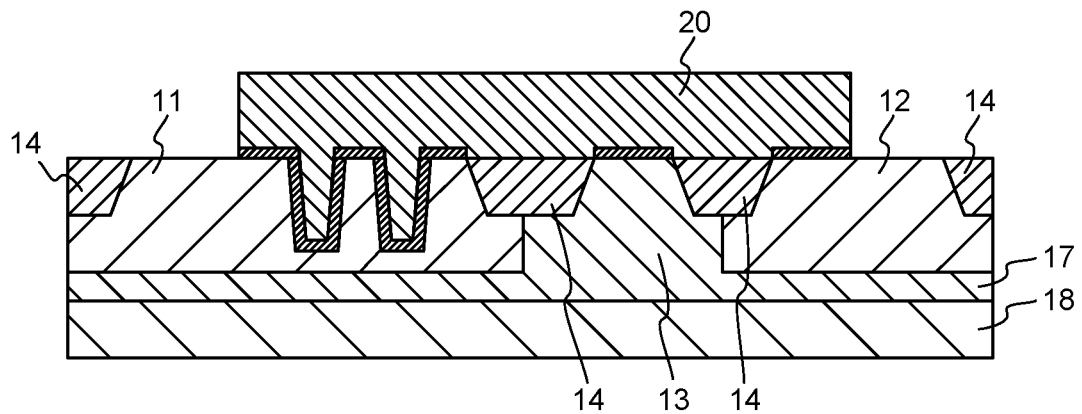
FIG. 6A is a cross-sectional view representing the cross-sectional surface on the line X-X in a gate polysilicon forming process.

Next, a polysilicon film is formed on the surface of the gate insulating film 21 by CVD method. In view of this, as illustrated in FIG. 6A, the gate polysilicon 20 is formed (STEP 109).

Figure 6B:
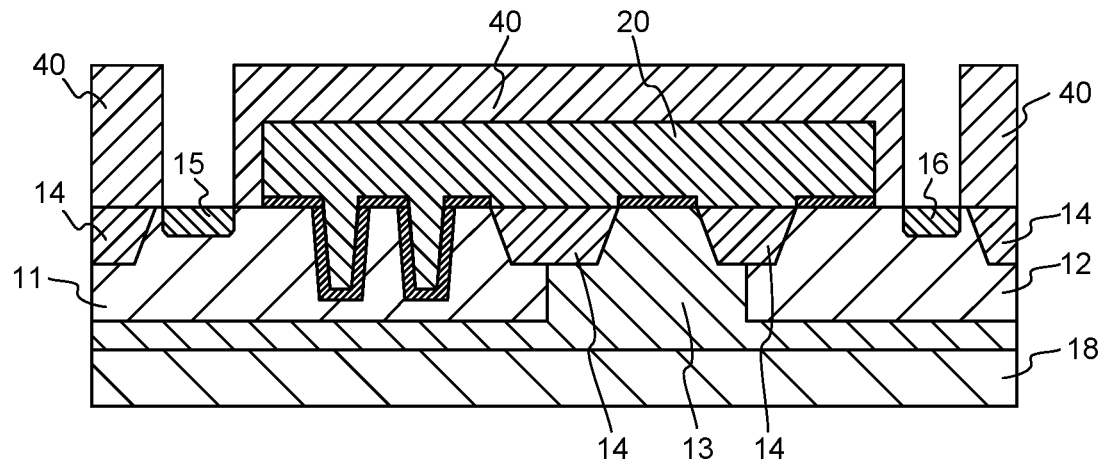
FIG. 6B is a cross-sectional view representing the cross-sectional surface on the line X-X in a diffusion layer forming process.

Next, as illustrated in FIG. 6B, the resist films 40 patterned on a surface of a wafer on which the above-described processes have been performed by photolithography are formed. Then, for example, as the second conductivity type (N type in this embodiment) impurities, P+ (phosphorus) or As+ (arsenic) is injected to the surfaces of the first well 11 and the second well 12 by ion implantation. This forms the diffusion layer 15 and the diffusion layer 16 of the second conductivity type (STEP 110).

Figure 6C:
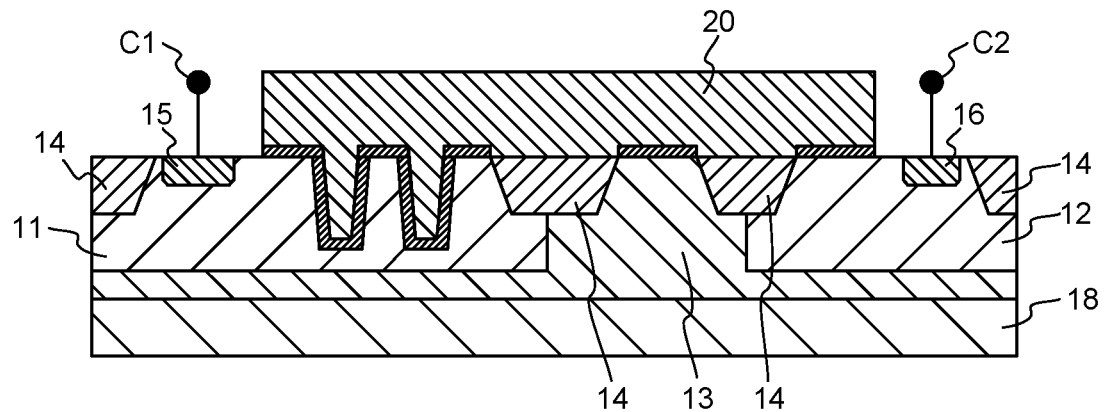
FIG. 6C is a cross-sectional view representing the cross-sectional surface on the line X-X in a contact forming process.

Next, contact holes are formed in the surface of the wafer on which the above-described processes have been performed, and these contact holes are filled by a conductor, such as tungsten. This forms the contacts C1 and C2 as illustrated in FIG. 6C (STEP 111).

The semiconductor device 100 is manufactured through the above-described processes.

As described above, since the trenches 30 are disposed in the first well 11, which constitutes the control gate, in the semiconductor device 100 of this embodiment, the area of the part where the control gate is opposed to the floating gate can be increased by the amount of the trenches 30. In view of this, compared with one not having grooves like the trenches 30, the areas of the control gate and the floating gate in the direction horizontal to the substrate surface can be decreased. Therefore, the semiconductor device 100 of this embodiment allows providing the non-volatile memory having the small area and the sufficient capacity.

Embodiment 2

Figure 7:
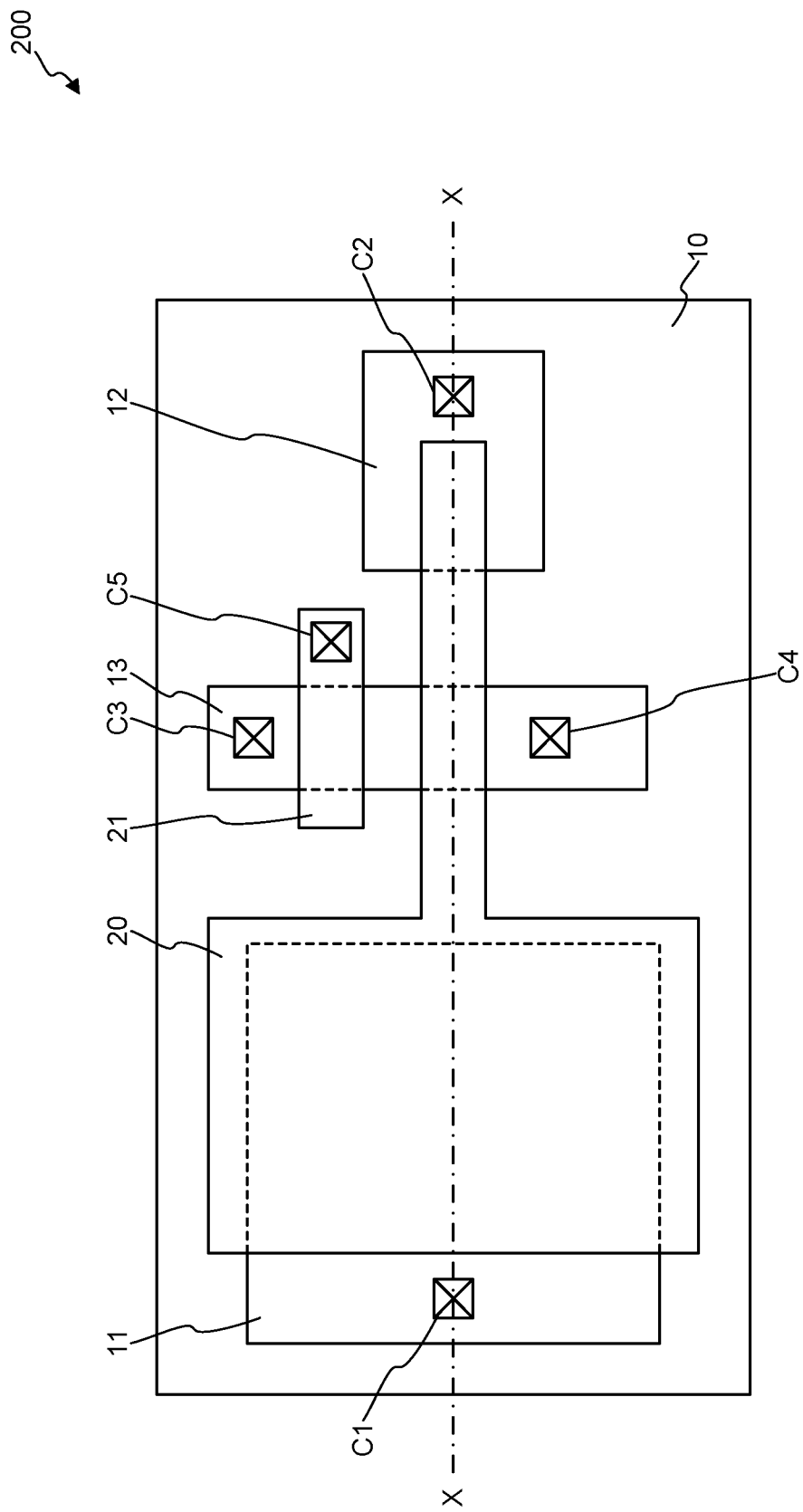
FIG. 7 is a top view illustrating a configuration of a semiconductor device according to Embodiment 2 of the present invention.
Figure 8:
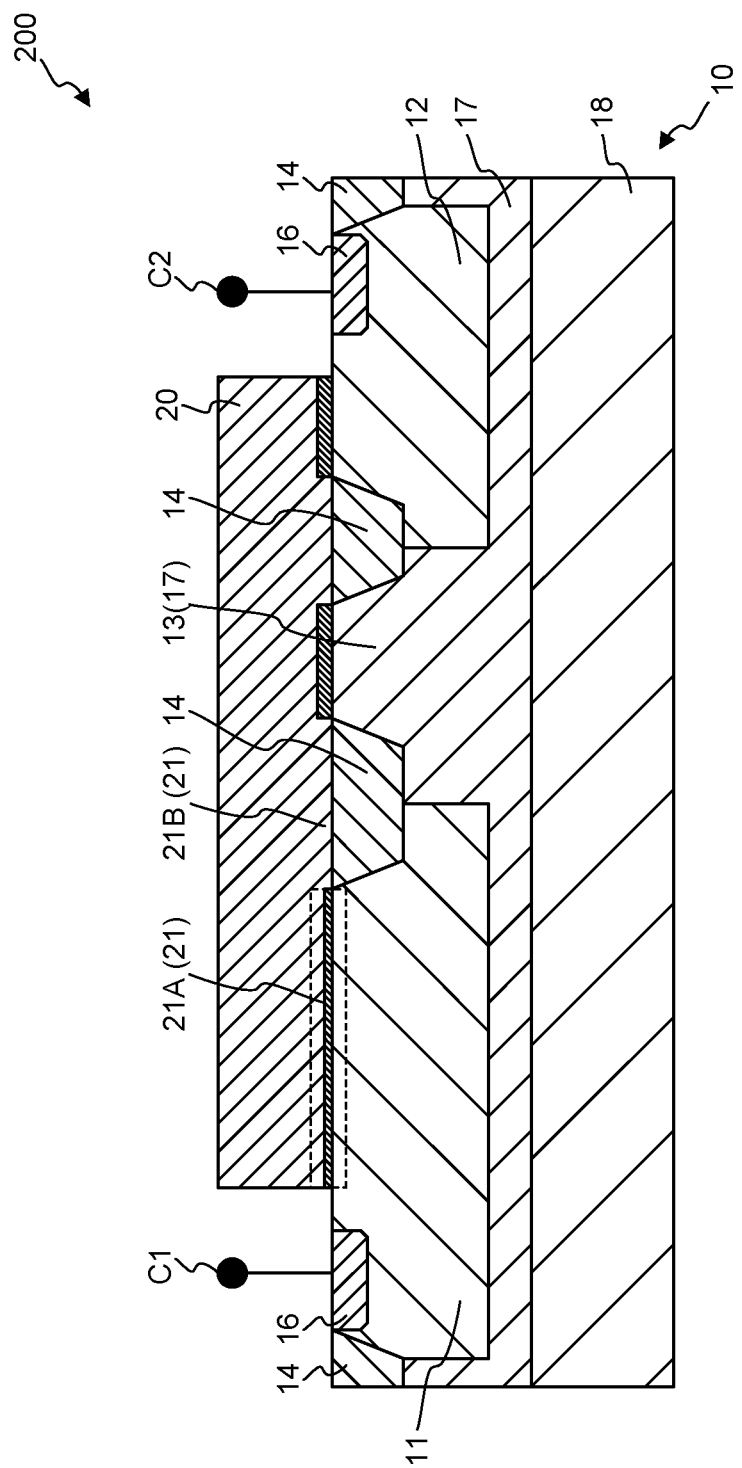
FIG. 8 is a cross-sectional view along the line X-X of the semiconductor device in FIG. 7.

Next, Embodiment 2 of the present invention will be described. FIG. 7 is a top view of a semiconductor device 200 according to the embodiment viewed from above an element formation surface. FIG. 8 is a cross-sectional view along the line X-X in FIG. 7.

The semiconductor device 200 of this embodiment does not include the trenches 30 in the first well 11, unlike the semiconductor device 100 of Embodiment 1 illustrated in FIG. 1 and FIG. 2. Meanwhile, in the semiconductor device 200 of this embodiment, unlike the semiconductor device 100 of Embodiment 1, a first region 21A having a relatively thin film thickness and a second region 21B having a relatively thick film thickness are formed in the gate insulating film 21.

The first region 21A is formed at a position where the first well 11 is opposed to the gate polysilicon 20 with the gate insulating film 21 interposed therebetween. The film thickness of the first region 21A is thinner than the film thickness of the gate insulating film 21 in the semiconductor device 100 of Embodiment 1. In contrast to this, the second region 21B has the film thickness to the extent similar to that of the gate insulating film 21 in the semiconductor device 100 of Embodiment 1.

In the semiconductor device 100 of this embodiment, the first region 21A of the gate insulating film 21 having the thin film thickness is disposed at the position where the first well 11 constituting the control gate is opposed to the gate polysilicon 20 constituting the floating gate. In view of this, compared with a memory cell that has the similar extent of the capacitance of the control gate and does not include the region having a thin film thickness, the semiconductor device 100 of this embodiment has the small area of the entire memory cell. This will be described below.

As described in Embodiment 1, when the capacitance is defined as C, the dielectric constant as ε, the inter-electrode distance as d, and the electrode area as A, the capacitance of the parallel-plate capacitor is expressed as the above-described equation (Math. 1).

In the single-layer polysilicon type memory cell like the semiconductor device 200 of this embodiment, when the capacitance of the control gate is defined as C, a distance of the part where the first well 11 constituting the control gate is opposed to the gate polysilicon 20 constituting the floating gate with the gate insulating film 21 interposed therebetween is equivalent to the inter-electrode distance d. Therefore, the shorter the distance between the first well 11 and the gate polysilicon 20 is (that is, the smaller the value d is), the larger the capacitance of the control gate is.

In the semiconductor device 100 of this embodiment, the first region 21A, which is the region having the thin film thickness, of the gate insulating film 21 is disposed at the part where the first well 11 is opposed to the gate polysilicon 20. In view of this, compared with a case where the region is not disposed, the semiconductor device 100 of this embodiment has the shorter distance between the first well 11 and the gate polysilicon 20. Therefore, the capacitance of the control gate is relatively large.

Provisionally, when the capacitance of the control gate equivalent to that of the semiconductor device 200 of this embodiment is attempted to be achieved in the structure in which the gate insulating film 21 does not include the region having the thin film thickness (that is, a structure in which the entire gate insulating film 21 has the film thickness equivalent to the second region 21B of this embodiment), the first well 11 and the gate polysilicon 20 need to be further extended in the horizontal direction to increase the area of the opposed parts. In view of this, a size of the entire memory cell increases.

In contrast to this, in the semiconductor device 200 of this embodiment, the value of the inter-electrode distance d is small and the electrode area A needs not to be increased. Accordingly, the semiconductor device 200 of this embodiment allows reducing the memory size small while maintaining the capacitance of the control gate.

The gate insulating film 21 in the semiconductor device 200 of this embodiment can be formed by forming the silicon oxide film having the film thickness of the second region 21B, and after removing a part of the region, by forming the silicon oxide film having the film thickness of the first region 21A in this part of the region again.

That is, first, by thermal oxidation method, the silicon oxide film is formed on the surface of the first well 11 and the surfaces of the second well 12 and the third well 13 so as to have a comparatively thick film thickness (that is, the film thickness of the second region 21B). Then, the part of this silicon oxide film covering the surface of the first well 11 is removed by etching. Then, a silicon oxide film is formed again on this part so as to have a comparatively thin film thickness (that is, the film thickness of the first region 21A) by thermal oxidation method.

As described above, in the semiconductor device 100 of this embodiment, the region having the thin film thickness of the gate insulating film 21 is formed at the part where the first well 11 constituting the control gate is opposed to the gate polysilicon 20 constituting the floating gate. In view of this, compared with a case of without the region having the thin film thickness, the areas in the direction horizontal to the substrate surface of the control gate and the floating gate can be decreased. Therefore, the semiconductor device 200 of this embodiment allows providing the non-volatile memory having the small area and the sufficient capacity.

Note that the present invention is not limited to the ones described in the embodiments. For example, in Embodiment 1, while the case where the openings of the trenches 30 have the rectangular shape in top view has been described as an example, the shape of the trenches 30 is not limited to this. For example, the trench 30 may be formed as a dimple having a circular shape, an oval shape, or the like in top view. Additionally, the shape of the trench 30 in cross-sectional view and the exemplified dimensions are not limited to the ones described in the embodiments. In short, it is only necessary to form a three-dimensional structure on the surface of the first well 11 such that the area of the part where the first well 11 is opposed to the gate polysilicon 20 with the gate insulating film 21 interposed therebetween becomes wide.

In Embodiment 1, while the case where the two trenches 30 are formed in the first well 11 has been described as an example, the number of trenches is not limited to this. That is, the number of trenches may be one or may be three or more. When the plurality of trenches are formed, these trenches may have the identical shape or may have mutually different shapes.

Additionally, the shapes of the first well 11, the second well 12, and the third well 13 in top view are not limited to the ones described in the embodiments.

In the embodiments, while the case where the floating gate is constituted using the gate polysilicon 20 as the conductive layer made of polysilicon has been described as an example, the floating gate may be constituted using a conductive layer made of another material other than polysilicon having a conductive property. Similarly, the trench lining conductive portion 32 may be made of a conductive material other than polysilicon.

In the embodiment, while the case where the gate insulating film 21 and the trench lining insulating film 31 are constituted of the silicon oxide film has been described as an example, the configuration is not limited to this, and they may be constituted using another material having an insulating property.

The manufacturing method described in the embodiments is one example, and manufacturing by processes different from the above-described processes may be employed. For example, in the embodiments, an example in which the semiconductor layer 17 having the first conductivity type is formed on the superficial layer portion of the semiconductor substrate 10 and the first well 11 and the second well 12 of the second conductivity type are formed by ion implantation to form the third well of the first conductivity type in the region between the first well 11 and the second well 12 has been described. However, different from this, the third well 13 may be formed by ion implantation without forming the semiconductor layer 17.

FIG. 9A to FIG. 9D are cross-sectional views of the semiconductor substrate 10 in each process in a modification of the manufacturing method up to the formation of the third well 13.

Figure 9A:
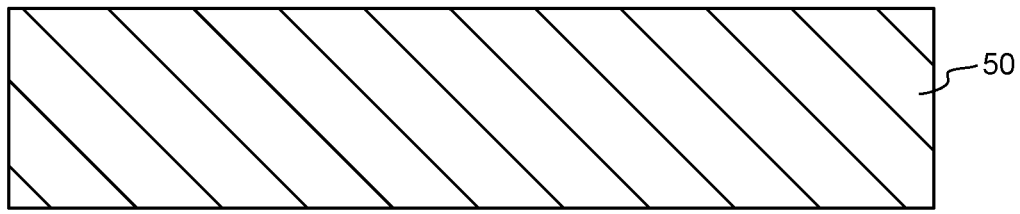
FIG. 9A is a cross-sectional view representing the cross-sectional surface on the line X-X in a semiconductor substrate preparation process of a modification.
Figure 9B:
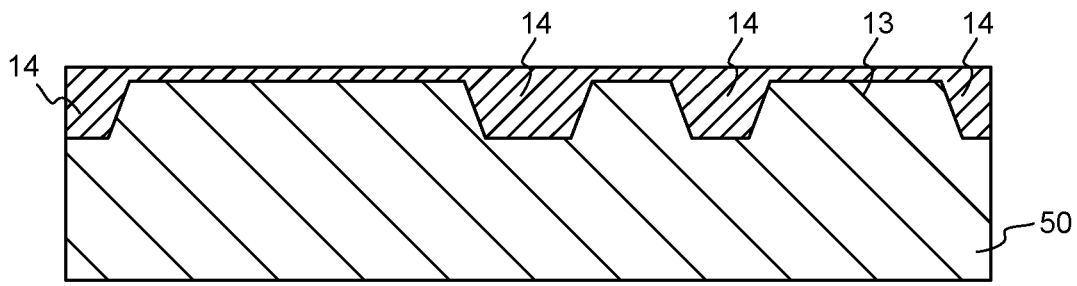
FIG. 9B is a cross-sectional view representing the cross-sectional surface on the line X-X in an element isolation region forming process of the modification.

First, as illustrated in FIG. 9A, a semiconductor substrate 50 of the first conductivity type (for example, a P type Si substrate) is prepared. Then, as illustrated in FIG. 9B, grooves are formed in the surface of the semiconductor substrate 50 by etching. An insulating film, such as $SiO_2$, is formed on the entire surface of the semiconductor substrate 50 including the grooves using CVD method to form the element isolation regions 14.

Figure 9C:
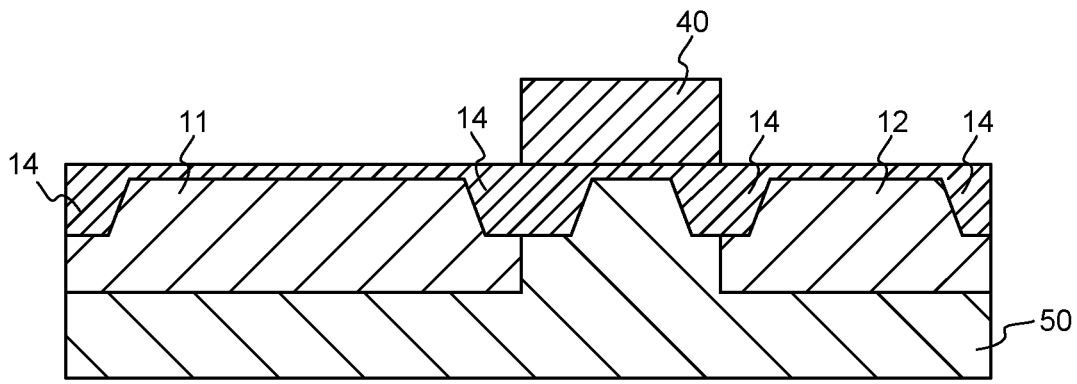
FIG. 9C is a cross-sectional view representing the cross-sectional surface on the line X-X in a N well forming process of the modification.

Next, as illustrated in FIG. 9C, the resist film 40 patterned by photolithography is formed on the surface of the semiconductor substrate 50. The second conductivity type (N type) impurities are injected to the surface of the semiconductor substrate 50 by ion implantation. This forms the first well 11 and the second well 12.

Figure 9D:
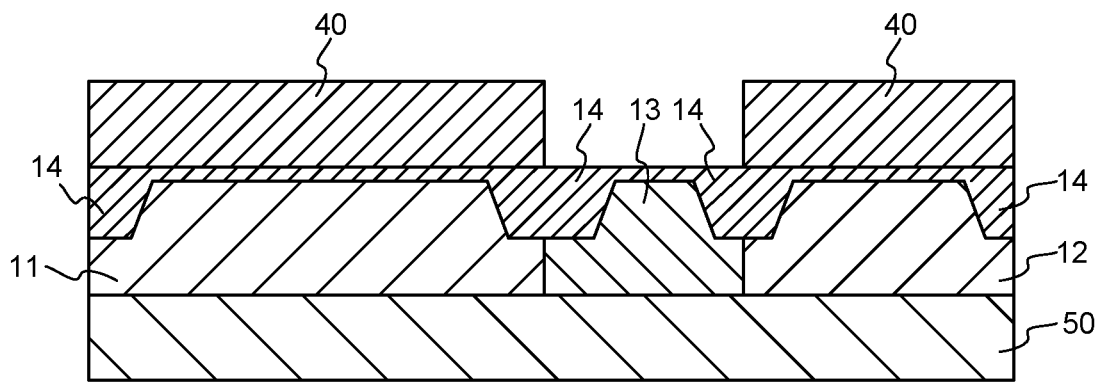
FIG. 9D is a cross-sectional view representing the cross-sectional surface on the line X-X in a P well forming process of the modification.

Then, as illustrated in FIG. 9D, the resist films 40 are formed on the top surfaces of the first well 11 and the second well 12, and the first conductivity type (P type) impurities are injected. This forms the third well 13. The manufacturing processes after that are similar to the manufacturing processes at and after the etching process (STEP 104, FIG. 4D) described in Embodiment 1.

Figure 10:
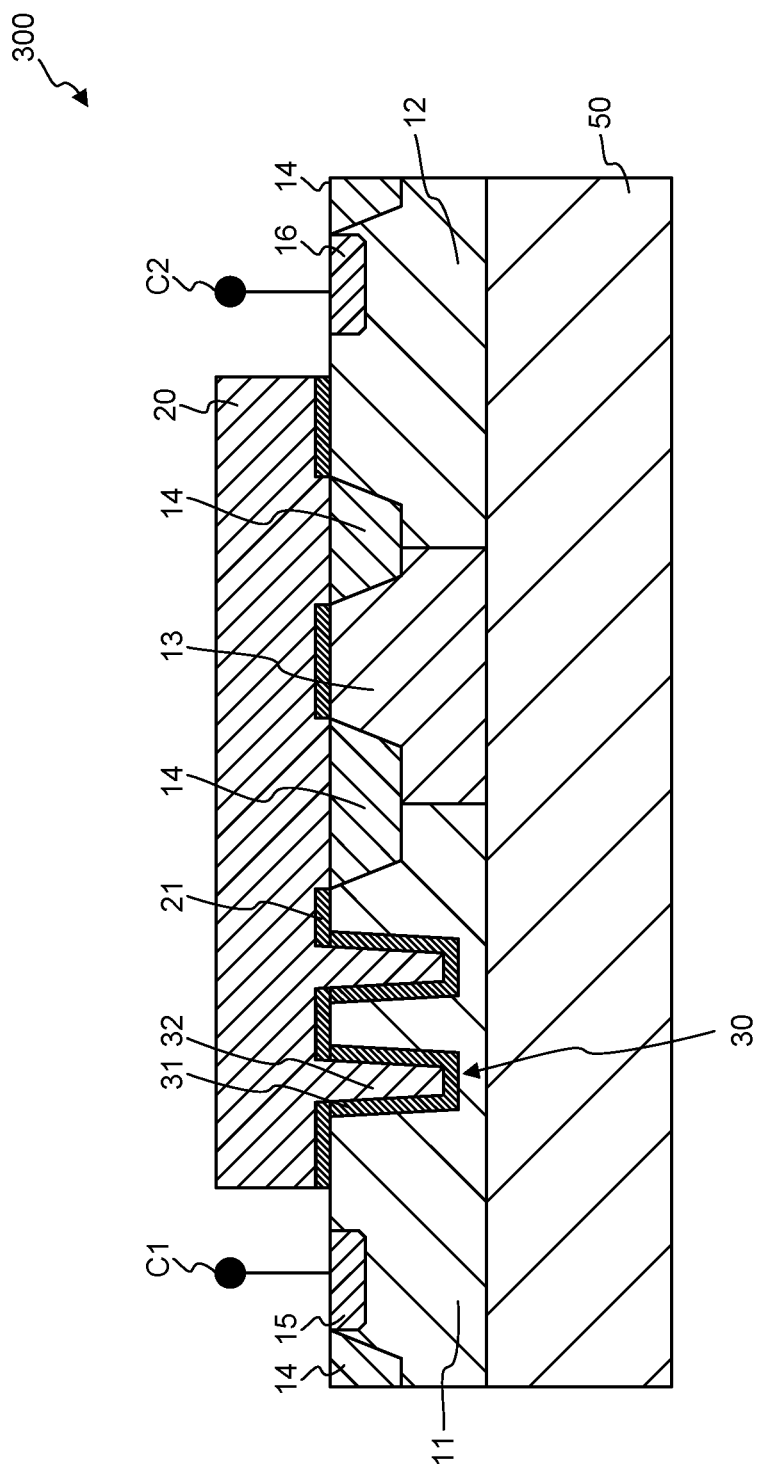
FIG. 10 is a cross-sectional view along the line X-X of the semiconductor device of a modification of Embodiment 1.

As illustrated in FIG. 10, the manufacturing process manufactures a semiconductor device 300 that does not include the semiconductor layer 17 (see FIG. 2) like the semiconductor device 100 of Embodiment 1, but includes the respective first well 11, second well 12, and third well 13 on the semiconductor substrate 50 of the first conductivity type.

Figure 11:
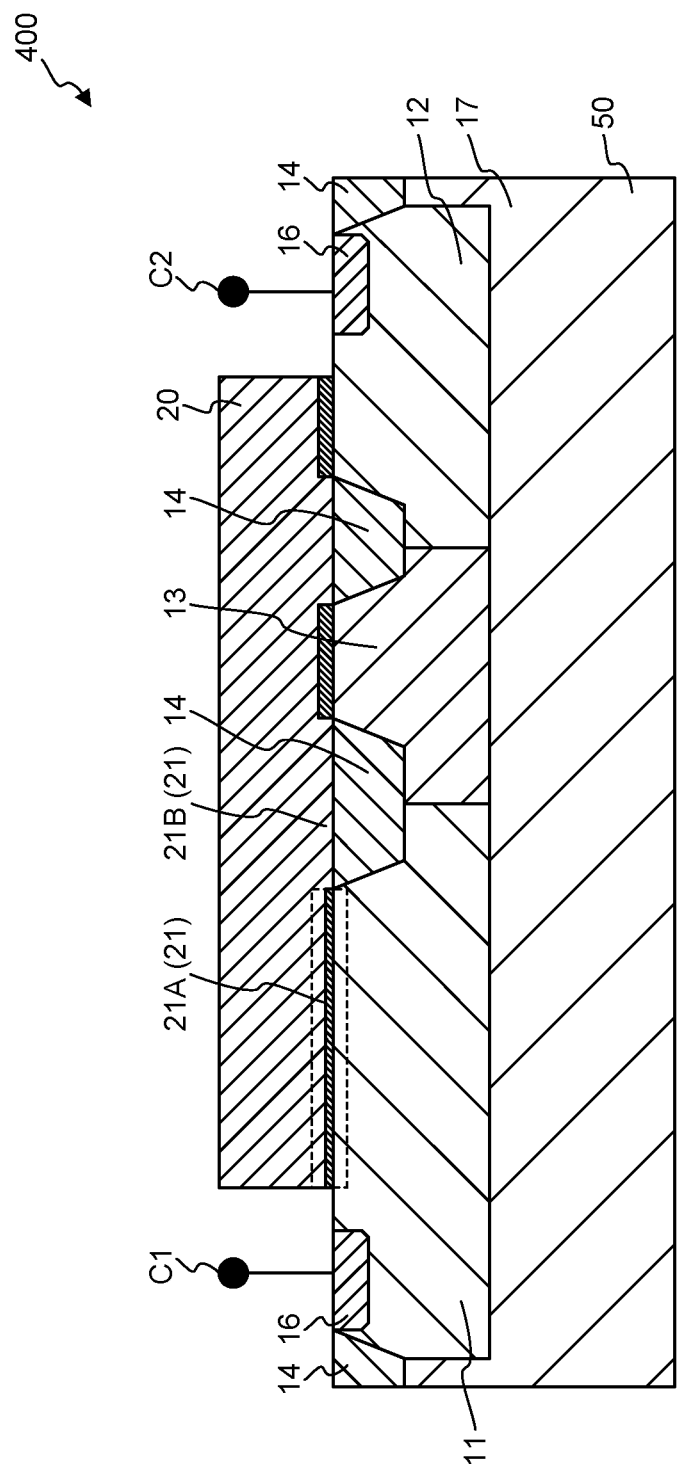
FIG. 11 is a cross-sectional view along the line X-X of the semiconductor device of a modification of Embodiment 2.

The manufacturing processes of FIG. 9A to FIG. 9D may be applied to Embodiment 2. In view of this, as illustrated in FIG. 11, a semiconductor device 400 that does not include the semiconductor layer 17 (see FIG. 8) like the semiconductor device 200 of Embodiment 2 but includes the respective first well 11, second well 12, and third well 13 on the semiconductor substrate 50 of the first conductivity type is manufactured.

Embodiment 1 and Embodiment 2 can be appropriately combined. That is, the trenches 30 may be disposed in the first well 11, and the first region 21A having the thin film thickness of the gate insulating film 21 may be disposed in the region where the first well 11 is opposed to the gate polysilicon 20.

What is claimed is:

1. A semiconductor device constituting a non-volatile memory, comprising:
    a semiconductor portion of a first conductivity type;
    a first well of a second conductivity type formed to extend from a first region in a surface of the semiconductor portion to an inside of the semiconductor portion, the second conductivity type having a polarity opposite of the first conductivity type;
    a second well of the second conductivity type formed to be separated from the first region so as to extend from a second region in the surface of the semiconductor portion to an inside of the semiconductor portion;
    an insulating film formed on the surface of the semiconductor portion; and
    a conductive layer formed on the insulating film to extend across a region on an upper side of the first well and a region on an upper side of the second well,
    wherein the first well includes a trench extending from the surface of the semiconductor portion to an inside of the first well, the insulating film continuously formed from the surface of the semiconductor portion to a surface inside the trench, and a conductive portion formed continuous with the conductive layer is disposed on the insulating film inside the trench.

2. The semiconductor device according to claim 1, wherein the semiconductor portion includes a third well of the first conductivity type in a region between the first well and the second well, and the third well extends from the surface of the semiconductor portion to an inside.

3. The semiconductor device according to claim 1, wherein the first well includes a first diffusion layer of the second conductivity type extending from the surface of the semiconductor portion to an inside of the first well; and
    the second well includes a second diffusion layer of the second conductivity type extending from the surface of the semiconductor portion to an inside of the second well.

4. The semiconductor device according to claim 1, wherein the conductive layer and the conductive portion are made of a polysilicon layer of the second conductivity type, and the insulating film is made of a silicon oxide film.

5. The semiconductor device according to claim 1, wherein the semiconductor portion includes a semiconductor substrate and a semiconductor layer of the first conductivity type, and the semiconductor layer extends from the surface of the semiconductor substrate to an inside of the semiconductor substrate.

6. The semiconductor device according to claim 1, wherein the semiconductor portion is a semiconductor substrate of the first conductivity type.

7. The semiconductor device according to claim 1, wherein the first conductivity type is P type, and the second conductivity type is N type.

* * * * *